(12) United States Patent
Kim et al.

(10) Patent No.: US 7,982,535 B2
(45) Date of Patent: Jul. 19, 2011

(54) AMP OUTPUT PROTECTIVE CIRCUIT FOR LCD PANEL SOURCE DRIVER

(75) Inventors: Jong-Cheol Kim, Goyang-si (KR); Jong-Kee Kim, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 34 days.

(21) Appl. No.: 12/641,050

(22) Filed: Dec. 17, 2009

(65) Prior Publication Data

US 2010/0164619 A1 Jul. 1, 2010

(30) Foreign Application Priority Data

Dec. 26, 2008 (KR) .................. 10-2008-0134179

(51) Int. Cl.
*H03F 1/52* (2006.01)

(52) U.S. Cl. .................................................. 330/207 P
(58) Field of Classification Search ................ 330/9, 51, 330/124 R; 345/204–207
See application file for complete search history.

*Primary Examiner* — Robert Pascal
*Assistant Examiner* — Khiem Nguyen
(74) *Attorney, Agent, or Firm* — Sherr & Vaughn, PLLC

(57) ABSTRACT

An AMP output protective circuit for an LCD panel source driver is disclosed. To solve a problem that internal diodes of PMOS/NMOS of an AMP output circuit are turned on, embodiments are characterized in making input and output voltages of the AMP in a charge sharing interval equal to HVDD and short-circuiting outputs of PAMP and NAMP with VRST_GH and VRST_GL lines, respectively. Accordingly, since there is no increase of voltage (Vth) attributed to a body effect, a speed is not reduced. An additional body bias control circuit is unnecessary. Power consumption can be reduced. Also, an AMP circuit can be more safely protected by adding an output reset function and an AMP protecting circuit.

13 Claims, 4 Drawing Sheets

AMP Output stage

AMP OUTPUT PROTECTIVE CIRCUIT FOR LCD PANEL SOURCE DRIVER

The present application claims priority under 35 U.S.C. 119 to Korean Patent Application No. 10-2008-0134179 (filed on Dec. 26, 2008), which is hereby incorporated by reference in its entirety.

BACKGROUND

An LCD panel source driver converts a group of externally inputted digital signals to an analog signal at a corresponding level, amplifies the converted analog signal by a prescribed amplification gain, and then provides the amplified analog signal as a panel source signal for driving a display panel.

FIG. 1 is a diagram of an AMP output stage circuit for an LCD panel source driver according to a related art. Referring to FIG. 1, if an output of PAMP or NAMP in an AMP output stage circuit becomes greater or smaller than HVDD, it may cause a problem that a diode 102/104 within PMOS/NMOS loaded in an output circuit within an amplifier can be turned on. Particularly, this problem may be caused if the circuit is reactivated for a whole charge sharing interval 200, as shown in FIG. 2, after completion of the charge sharing.

As mentioned in the foregoing description, in the AMP output stage circuit according to the related art, since a source voltage of the PMOS/NMOS is higher than a body voltage, a threshold voltage Vth attributed to a body effect is raised. In this case, a body bias control circuit is added, which increases a die area. Moreover, if an attempt is made to protect the output of the AMP using a protective diode only, the size of the diode needs to increase. Therefore, a corresponding die area must be increased as well.

SUMMARY

Embodiments relate to an amplifier output circuit, and more particularly, to an amplifier output protective circuit for an LCD panel source driver. Although embodiments are suitable for a wide scope of applications, they are particularly suitable for performing a switching control for amplifier protection in an AMP (amplifier) output circuit for an LCD panel source driver that uses ½ VDD. Accordingly, embodiments relate to an AMP output protective circuit, which eliminates the need for an additional body bias control circuit, reduces power consumption, and allows the AMP circuit to be more safely protected.

Embodiments relate to an AMP output protective circuit for an LCD panel source driver which may include a first amplifier biased by first and second power source voltages, a second amplifier biased by the second power source voltage and a third power source voltage, an input enable switching unit having switches connected between a first input line and an input terminal of the first amplifier and between a second input line and an input terminal of the second amplifiers, an input HVDD switching unit having switches connected between the input terminal of the first amplifier and a second power line for supplying the second power source voltage and between the input terminal of the second amplifier and the second power line, and an output HVDD switching unit having switched connected between an output terminal of the first amplifier and the second power line and between the second power line and the output terminal of the second amplifier.

The AMP output protective circuit may further include a first diode forward connected from the second power line toward the output terminal of the first amplifier and a second diode forward connected from the output terminal of the second amplifier toward the second power line. The AMP output protective circuit may further include a first output pad, a second output pad, and an output selection switching unit including switches switched to enable output stages of the first and second amplifiers to be selectively connected to the first and second output pads, respectively. In addition, the AMP output protective circuit may further include a first resistor connected between the first output pad and the output selection switching unit and a second resistor connected between the second output pad and the output selection switching unit.

The AMP output protective circuit may further include a first reset switch connected between the one end of the first resistor and a first reset line for supplying a first reset voltage and a second reset switch connected between the one end of the second resistor and a second reset line for supplying a second reset voltage.

Embodiments relate to a method of driving an AMP output protective circuit for an LCD panel source driver which may include: biasing a first amplifier by first and second power source voltages; biasing a second amplifier by the second power source voltage and a third power source voltage; connecting switches between a first input line and an input terminal of the first amplifier and between a second input line and an input terminal of the second amplifiers in an input enable switching unit; connecting switches between the input terminal of the first amplifier and a second power line for supplying the second power source voltage and between the input terminal of the second amplifier and the second power line in an input HVDD switching unit; and connecting switches between an output terminal of the first amplifier and the second power line and between the second power line and the output terminal of the second amplifier in an output HVDD switching unit.

Accordingly, since there is no increase of a voltage Vth attributed to a body effect, circuit speed is not reduced. Since an additional body bias control signal is unnecessary, die area and power consumption can be reduced. Moreover, by adding an output reset function and an AMP protective circuit, embodiments are able to protect the AMP circuit more safely.

DRAWINGS

Figure 1:
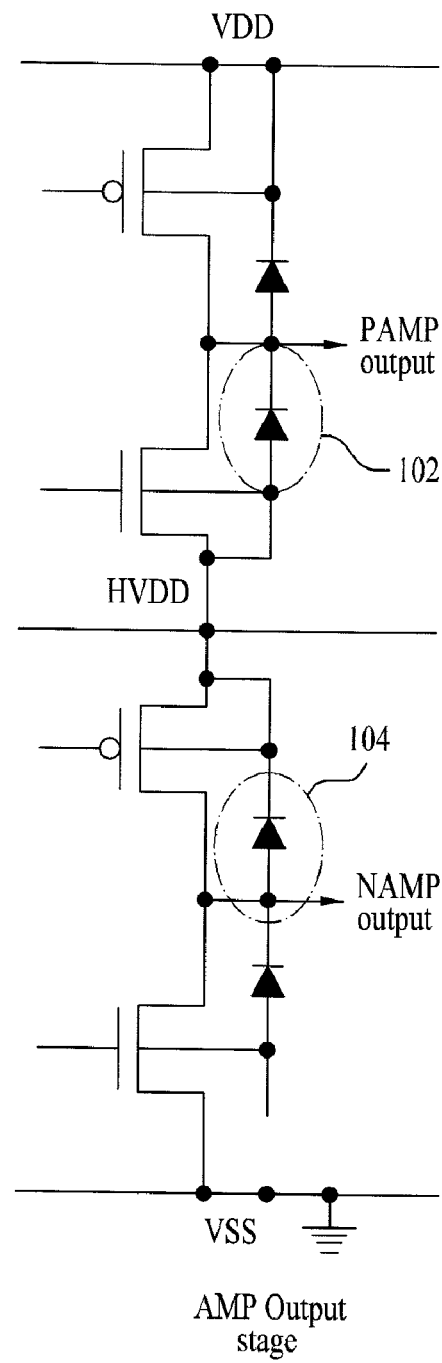
FIG. 1 is a diagram of an AMP output stage circuit for an LCD panel source driver according to a related art.
Figure 2:
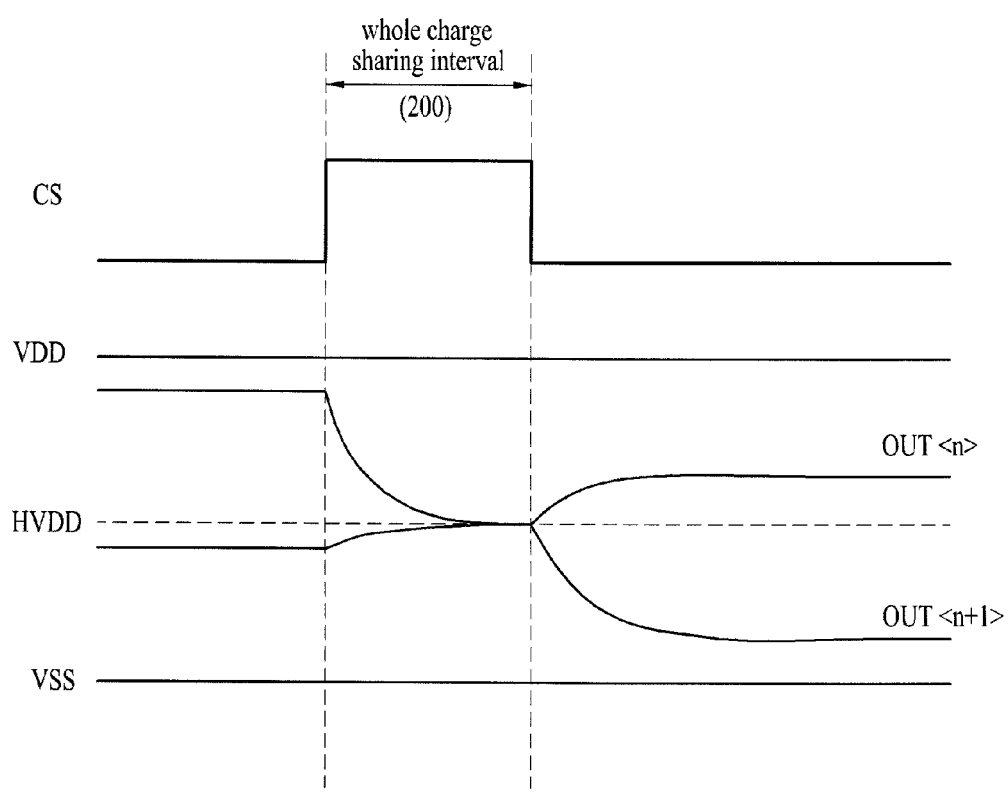
FIG. 2 is a diagram of a general charge sharing interval.
Figure 3:
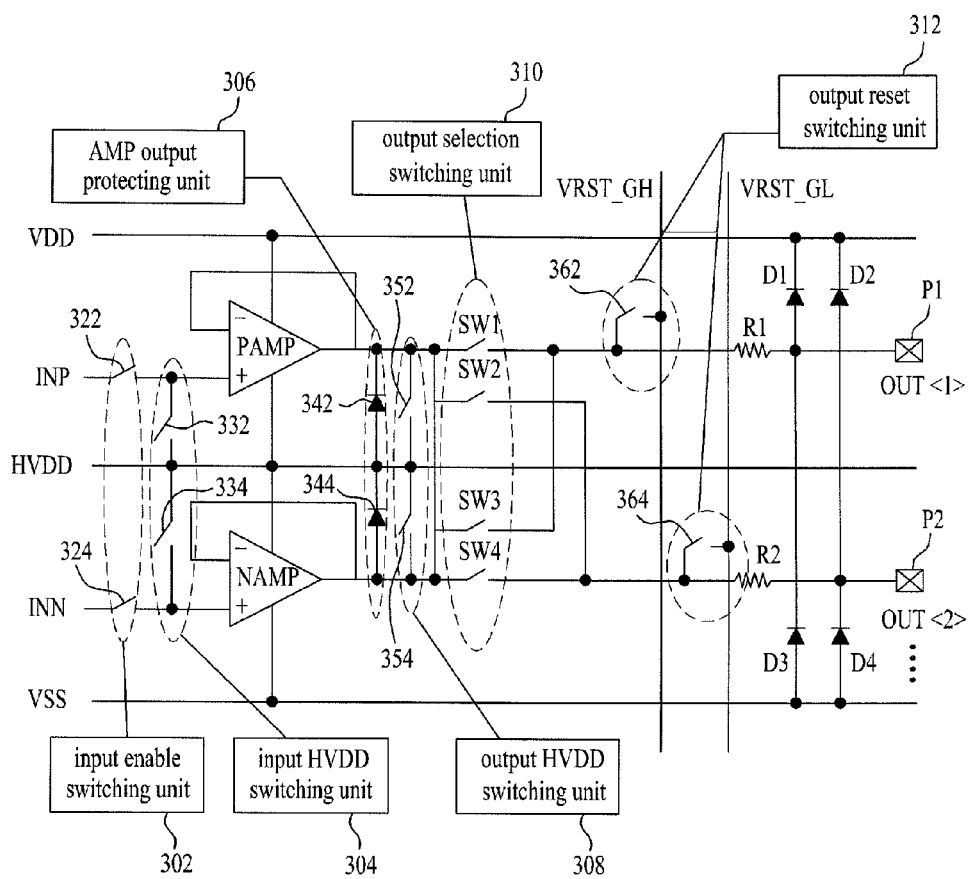

Example FIG. 3 is a diagram for a structure of an AMP output protective circuit for an LCD panel source driver according to embodiments.

Figure 4:
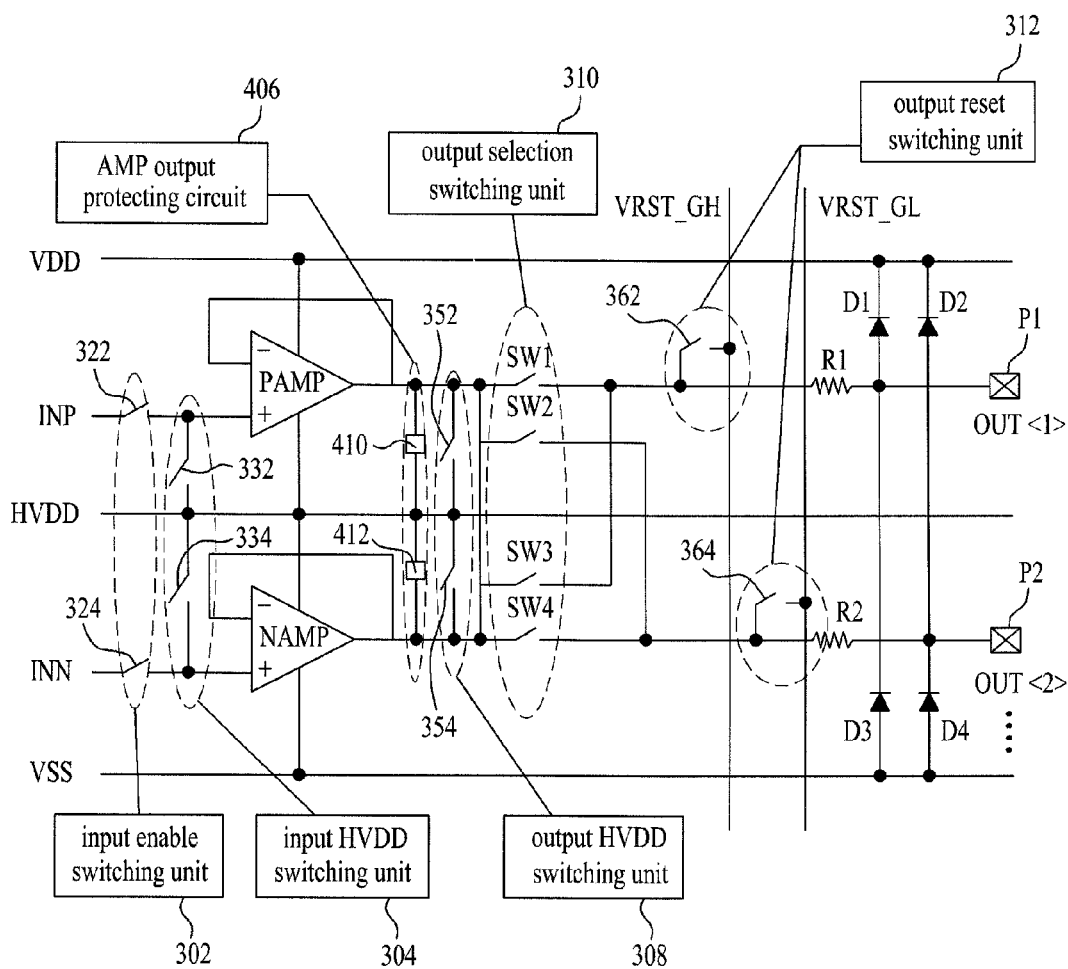

Example FIG. 4 is a diagram for a structure of an AMP output protective circuit for an LCD panel source driver according to embodiments.

DESCRIPTION

Embodiments provide an AMP output protective circuit for an LCD panel source driver, by which an input/output voltage of an amplifier can become HVDD by opening an input enable switch during a charge sharing interval and closing an input HVDD switch and an output HVDD switch. Embodiments provide an AMP output protective circuit for an LCD panel source driver, by which PAMP/NAMP output is short-circuited with a VRST_GH/VRST_GL line by opening an output HVDD switch, closing an output selection switch and closing an output reset switch, while input and output voltages of an amplifier in an AMP output circuit for an LCD panel source driver are made to become HVDD. In addition, embodiments provide an AMP output protective circuit for an LCD panel source driver, by which an AMP circuit can be safely protected by adding an AMP protective diode to an AMP circuit for an LCD panel source driver.

Example FIG. 3 is a diagram for a structure of an AMP output protective circuit for an LCD panel source driver according to embodiments. Referring to example FIG. 3, an AMP output protective circuit for an LCD panel source driver may include a first amplifier PAMP, a second amplifier NAMP, an input enable switching unit 302, an input HVDD switching unit 304, an AMP output protecting unit 306, an output HVDD switching unit 308, an output selection switching unit 310, an output reset switching unit 312, a first output resistor R1, a second output resistor R2, a first output pad P1, a second output pad P2, and first to fourth output diodes D1 to D4.

The first amplifier PAMP may be biased by a first power source voltage VDD and a second power source voltage HVDD. The second amplifier NAMP may be biased by the second power source voltage HVDD and a third power source voltage VSS.

Each of the first and second amplifiers PAMP and NAMP can include a buffer type amplifier having a gain set to 1. The PAMP, NAMP and switching units (302, 304, 306, 308, 310) can use NMOS or PMOS operating at a half VDD (=½*VDD). Moreover, a charge sharing switch (not shown in the drawing) can include NMOS and PMOS operating at full VDD (=VDD).

The input enable switching unit 302 may include a first switch 322 connected between a first input line INP and an input terminal (e.g., a positive terminal) of the first amplifier PAMP and a second input line INN and an input terminal (e.g., a positive terminal) of the second amplifier NAMP. The input HVDD switching unit 304 may include a third switch 332 connected between the input terminal (e.g., a positive terminal) of the first amplifier PAMP and a second power line for supplying the second power source voltage HVDD and a fourth switch 334 connected between the input terminal (e.g., the positive terminal) of the second amplifier NAMP and the second power line.

The AMP output protecting unit 306 may include a first diode 342 forward connected from the second power line toward the output terminal of the first amplifier PAMP and a second diode 344 forward connected from the output terminal of the second amplifier NAMP toward the second power line. The output HVDD switching unit 308 may include a fifth switch 352 connected between the output terminal of the first amplifier PAMP and the second power line and a sixth switch 354 connected between the second power line and the output terminal of the second amplifier NAMP.

The output selection switching unit 310 may include first to fourth output switched SW1 to SW4. The first output switch SW1 may be connected between the output terminal of the first amplifier PAMP and one end of the first resistor R1. The second output switch SW2 may be connected between the output terminal of the first amplifier PAMP and one end of the second resistor R2. The third output switch SW3 may be connected between the output terminal of the second amplifier NAMP and one end of the first resistor R1. The fourth output switch SW4 may be connected between the output terminal of the second amplifier NAMP and one end of the second resistor R2.

The other end of the first resistor R1 may be connected to the first pad P1, while the other end of the second resistor R2 may be connected to the second pad P2. The output reset switching unit 312 may include a first reset switch 362 and a second reset switch 364. The first reset switch 362 may be connected between one end of the first resistor R1 and a first reset line for supplying a first reset voltage VRST_GH. The second reset switch 364 may be connected between one end of the second resistor R2 and a second reset line for supplying a second reset voltage VRST_GL.

The first output diode D1 may be connected to the other end of the first resistor R1 and a VDD power line for supplying a first power source voltage VDD. A forward direction of the first output diode D1 starts from the other end of the first resistor R1 toward the VDD power line. The second output diode D2 may be connected to the other end of the second resistor R2 and the VDD power line for supplying a first power source voltage VDD. A forward direction of the second output diode D2 starts from the other end of the second resistor R2 toward the VDD power line.

The third output diode D3 may be connected to the other end of the first resistor R1 and a VSS line for supplying a third power source voltage VSS. A forward direction of the third output diode D3 starts from the VSS line toward the other end of the first resistor R1. The fourth output diode D4 may be connected to the other end of the second resistor R2 and the VSS power line. A forward direction of the fourth output diode D4 starts from the VSS line toward the other end of the second resistor R2.

In the following description, in order to explain an operational process off an AMP output protective circuit, assume 'first power source voltage (VDD)=16V', 'second power source voltage (HVDD)=8V' and 'third power source voltage (VSS)=0V', When a charge sharing switch is turned on, a reset voltage VRST can have a range between maximum '(16+8)/2=12V' and minimum '(8+0)/2=4V'. Thereafter, if the charge sharing switch is turned off and the output selection switching unit 310 is turned on, the following two cases may occur. 1) If VRST=12V, since an NAMP output is greater than 8.7V (=8V+0.7V), it may cause a problem that an internal p-n diode of PMOS of an NAMP output stage circuit is turned on. 2) If VRST=4V, since a PAMP output is greater than 7.3V (=88V−0.7V), it may cause a problem that an internal p-n diode of NMOS of a PAMP output stage circuit is turned on.

To solve the above two problems, both input and output voltages of each of the first and second amplifiers PAMP and NAMP may be made equal to the second power source voltage HVDD by opening the switches 322 and 324 of the input enable switching unit 302 connected to the first and second input lines INP and INN respectively in the charge sharing interval and selectively closing the switches 332 and 334 of the input HVDD switching unit 304 and the switches 352 and 354 of the output HVDD switching unit 308.

After both of the input and output voltages of each of the first and second amplifiers PAMP and NAMP have been made equal to the second power source voltage HVDD, the switches 352 and 354 of the output HVDD switching unit 308 may be opened, the switches SW1 to SW4 of the output selection switching unit 310 may be closed, and the switches 362 and 364 of the output reset switching unit 312 may be closed. Therefore, the output stage of the first amplifier PAMP may be short-circuited with the first reset voltage line and the output stage of the second amplifier NAMP may be short-circuited with the second reset voltage line.

In this way, both of the input and output voltages of each of the first and second amplifiers PAMP and NAMP can be made equal to a preset voltage (e.g., the second power source voltage (HDD=8V)). Moreover, in order to protect the first and second amplifiers PAMP and NAMP more safely in a charge sharing interval, the AMP output protecting unit 306 may be used. The AMP output protecting unit 306 can be implemented with Schottky barrier diodes (hereinafter abbreviated SBD). Since a turn-on voltage of the Schottky barrier diode may be set to a turn-on voltage (0.3~0.5 V) smaller than that (0.6~0.88 V) of a diode within the PMOS or NMOS, the Schottky barrier diodes may be turned on before the diodes within the PMOS and NMOS are turned on. Therefore, these arrangements are able to protect the AMP circuit.

Example FIG. 4 is a diagram for a structure of an AMP output protective circuit for an LCD panel source driver according to embodiments. Referring to example FIG. 4, an AMP output protective circuit for an LCD panel source driver according to embodiments may be almost identical to the former AMP output protective circuit for the LCD panel source driver, which is shown in example FIG. 3, except for the substitution of general diodes 410 and 412 for the Schottky barrier diodes 342 and 344.

The circuit operation for the AMP protection may be identical to that shown in example FIG. 3. To protect the AMP in the charge sharing interval more safely, since the turn-on voltage of the diodes 410 and 412 of the AMP output protective circuit 406 is smaller than the turn-on voltage of the internal diodes of the PMOS and NMOS, the diodes 410 and 412 may be turned on before the internal diodes are turned on. Therefore, these arrangements are able to protect the AMP circuit.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a first amplifier biased by first and second power source voltages;
    a second amplifier biased by the second power source voltage and a third power source voltage;
    an input enable switching unit including switches connected between a first input line and an input terminal of the first amplifier and between a second input line and an input terminal of the second amplifiers;
    an input HVDD switching unit including switches connected between the input terminal of the first amplifier and a second power line for supplying the second power source voltage and between the input terminal of the second amplifier and the second power line; and
    an output HVDD switching unit including switches connected between an output terminal of the first amplifier and the second power line and between the second power line and the output terminal of the second amplifier.

2. The apparatus of claim 1, including:
    a first diode forward connected from the second power line toward the output terminal of the first amplifier; and
    a second diode forward connected from the output terminal of the second amplifier toward the second power line.

3. The apparatus of claim 1, including:
    a first output pad; and
    a second output pad.

4. The apparatus of claim 3, including an output selection switching unit including switches to enable output stages of the first and second amplifiers to be selectively connected to the first and second output pads, respectively.

5. The apparatus of claim 4, including:
    a first resistor connected between the first output pad and the output selection switching unit; and
    a second resistor connected between the second output pad and the output selection switching unit.

6. The apparatus of claim 5, wherein the output selection switching unit includes:
    a first output switch connected between the output terminal of the first amplifier and one end of the first resistor;
    a second output switch connected between the output terminal of the first amplifier and one end of the second resistor;
    a third output switch connected between the output terminal of the second amplifier and the one end of the first resistor; and
    a fourth output switch connected between the output terminal of the second amplifier and one end of the second resistor.

7. The apparatus of claim 6, including:
    a first reset switch connected between the one end of the first resistor and a first reset line for supplying a first reset voltage; and
    a second reset switch connected between the one end of the second resistor and a second reset line for supplying a second reset voltage.

8. The apparatus of claim 2, wherein the first and second diodes are Schottky barrier diodes.

9. A method comprising:
    biasing a first amplifier by first and second power source voltages;
    biasing a second amplifier by the second power source voltage and a third power source voltage;
    connecting switches between a first input line and an input terminal of the first amplifier and between a second input line and an input terminal of the second amplifiers in an input enable switching unit;
    connecting switches between the input terminal of the first amplifier and a second power line for supplying the second power source voltage and between the input terminal of the second amplifier and the second power line in an input HVDD switching unit; and
    connecting switches between an output terminal of the first amplifier and the second power line and between the second power line and the output terminal of the second amplifier in an output HVDD switching unit.

10. The method of claim 9, including:
    selectively connecting output stages of the first and second amplifiers to first and second output pads, respectively, by enabling switches with an output selection switching unit.

11. The method of claim 10, including:
    running current through a first resistor connected between the first output pad and the output selection switching unit; and
    running current through a second resistor connected between the second output pad and the output selection switching unit.

12. The method of claim 11, in the output selection switching unit:
    connecting a first output switch between the output terminal of the first amplifier and one end of the first resistor;
    connecting a second output switch between the output terminal of the first amplifier and one end of the second resistor;
    connecting a third output switch between the output terminal of the second amplifier and the one end of the first resistor; and
    connecting a fourth output switch between the output terminal of the second amplifier and the one end of the second resistor.

13. The method of claim 12, including:
    supplying a first reset voltage through a first reset switch connected between the one end of the first resistor and a first reset line; and
    supplying a second reset voltage through a second reset switch connected between the one end of the second resistor and a second reset line.

* * * * *